United States Patent
Lee et al.

(10) Patent No.: US 12,094,719 B2
(45) Date of Patent: Sep. 17, 2024

(54) ETCHING PATTERN FORMING METHOD IN SEMICONDUCTOR MANUFACTURING PROCESS

(71) Applicant: YOUNG CHANG CHEMICAL CO., LTD, Gyeongsangbuk-do (KR)

(72) Inventors: Su Jin Lee, Daegu (KR); Gi Hong Kim, Daegu (KR); Seung Hun Lee, Daegu (KR); Seung Hyun Lee, Daegu (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 348 days.

(21) Appl. No.: 17/434,955

(22) PCT Filed: Mar. 6, 2020

(86) PCT No.: PCT/KR2020/003137
§ 371 (c)(1),
(2) Date: Aug. 30, 2021

(87) PCT Pub. No.: WO2020/184904
PCT Pub. Date: Sep. 17, 2020

(65) Prior Publication Data
US 2022/0172955 A1    Jun. 2, 2022

(30) Foreign Application Priority Data
Mar. 13, 2019    (KR) ........................ 10-2019-0028812

(51) Int. Cl.
*H01L 21/311* (2006.01)
*H01L 21/02* (2006.01)
*H01L 21/033* (2006.01)

(52) U.S. Cl.
CPC .. *H01L 21/31116* (2013.01); *H01L 21/02282* (2013.01); *H01L 21/0337* (2013.01); *H01L 21/0214* (2013.01)

(58) Field of Classification Search
None
See application file for complete search history.

(56) References Cited

U.S. PATENT DOCUMENTS

| | | |
|---|---|---|
| 2006/0040103 A1 | 2/2006 | Whiteford et al. |
| 2007/0134916 A1* | 6/2007 | Iwabuchi ................ G03F 7/091 438/669 |
| 2008/0073322 A1* | 3/2008 | Nozaki ............. H01L 21/31144 216/49 |
| 2011/0223524 A1 | 9/2011 | Sun et al. |
| 2017/0154766 A1* | 6/2017 | Ogihara .................... G03F 7/38 |
| 2017/0315445 A1* | 11/2017 | Hashimoto ......... H01L 21/3081 |

FOREIGN PATENT DOCUMENTS

| | | |
|---|---|---|
| CN | 109313401 A | 2/2019 |
| KR | 10-0712473 B1 | 4/2007 |
| KR | 10-2007-0072334 A | 7/2007 |
| KR | 10-2008-0025818 A | 3/2008 |
| KR | 10-2009-0001023 A | 1/2009 |
| KR | 10-2009-0003724 A | 1/2009 |

OTHER PUBLICATIONS

Technical Datasheet for 3M FC-4330 product (Year: 2016).*

* cited by examiner

*Primary Examiner* — Sean M DeGuire
*Assistant Examiner* — Andrew Preston Traywick
(74) *Attorney, Agent, or Firm* — NKL Law; Jae Youn Kim

(57) ABSTRACT

The present disclosure relates to a method of forming an etching pattern in a semiconductor manufacturing process. Unlike a conventional method of forming a four-layer structure composed of a photoresist film, an anti-reflective film, a SiON film, and an organic hard mask film on a wafer, as preparation for an etching process, the method according to the present disclosure is an innovative etching pattern forming method capable of implementing the same etching pattern as is formed by the conventional method, using a double-layer structure composed of a photoresist film and a multifunctional organic-inorganic mask film.

4 Claims, No Drawings

ETCHING PATTERN FORMING METHOD IN SEMICONDUCTOR MANUFACTURING PROCESS

TECHNICAL FIELD

The present disclosure relates to a method of forming an etching pattern in a semiconductor manufacturing process. Unlike a conventional method of forming a four-layer structure composed of a photoresist film, an anti-reflective film, a SiON film, and an organic hard mask film on a wafer, as preparation for an etching process, the method according to the present disclosure is an innovative etching pattern forming method capable of implementing the same etching pattern as is formed by the conventional method, using a double-layer structure composed of a photoresist film and a multifunctional organic-inorganic mask film.

BACKGROUND ART

With the recent increase in demand for semiconductors, there is an urgent need for efforts to increase productivity efficiency by simplifying manufacturing processes along with large-scale investments in semiconductor manufacturing equipment.

In response to the need for the realization of fine patterns due to the miniaturization and increased integration of semiconductor devices, a method has been proposed in which a high-resolution photoresist, an anti-reflective film for preventing pattern defects attributable to diffuse reflection of the photoresist, and an inorganic film and an organic hard mask film for increasing etch selectivity are sequentially formed on a wafer. This known method is widely used as a coating film forming technique for forming an etching pattern in current semiconductor manufacturing.

Typically, a four-layer structure composed of a photoresist film, an anti-reflective film, a SiON film, and an organic hard mask film is formed on a wafer. The formation of each coating film involves multiple processes ranging from a minimum of two processes to a maximum of six processes, including coating, heat treatment, exposure, development, and the like. This means that a total of 8 to 24 processes are required to form the four-layer structure.

When any one of the four coating films can be eliminated, or any one of the two to six processes for forming each coating film can be omitted, not only production time and cost but also manufacturing equipment investment and maintenance costs can be dramatically reduced.

To this end, ongoing efforts have been made to combines some of the physical properties of each coating film, but these efforts have yet to yield the desired results due to the difficulty in satisfying the physical properties required for each coating film. Although there are several inventions and papers discussing a material that combines the properties of an anti-reflective film and an inorganic film represented by a SiON film, this material technique is currently in very limited use.

This is because, due to the conflicting properties of the organic anti-reflective film and the silicon inorganic film, the material cannot function as the anti-reflective film but can function as only the inorganic film. Conversely, it cannot function as the inorganic film but can function as only the anti-reflective film.

In addition, it has been impossible to integrate an inorganic film such as a SiON film and an organic hard film mainly composed of carbon due to different etching ratios for oxygen or fluoride gas, attributable to different physical properties thereof. One possible approach is to increase the thickness of an organic hard film and to perform deeper etch. However, this cannot be regarded as an improved method because it essentially requires the use of an anti-reflective film and an inorganic film.

Another possible approach is to increase the thickness of an inorganic film. However, since the inorganic film is a glass film, when the inorganic film becomes thicker, the inorganic film is likely to crack during heat treatment or to be non-uniform in the thickness thereof. Thus, it is recommendable to increase the thickness of the inorganic film to the extent that it is possible to replace the organic hard film.

As a solution to the above problems of the related art, the inventors of the present application have developed a pre-etching coating technology by which one innovative coating film can replace conventional three coating films including an anti-reflective film, an inorganic film, and an organic film by employing a new coating composition. The innovative coating film formed from the coating composition prevents diffuse reflection of a photoresist film, has sufficient etching resistance against inorganic and organic etching gases, has uniform coating properties without having surface defects such as cracks, and has a sufficient thickness.

DISCLOSURE

Technical Problem

The objective of the present disclosure is to provide a method of forming a novel etching pattern having a double-layer structure composed of a photoresist film and a multifunctional organic-inorganic film on a wafer to replace a conventional etching pattern having a four-layer structure composed of a photoresist film, an anti-reflective film, a SiON film, and an organic hard mask film, as preparation for an etching process.. Compared to the conventional method, the method according to the present disclosure dramatically reduces the production time and process cost by simplifying a semiconductor manufacturing process, reduces costs for investment and maintenance of machines by not requiring expensive coating and deposition machines required by the conventional method, and dramatically reduces raw material costs by not using expensive raw materials, such as precursors, deposition equipment, and expensive organic hard masks used for chemical deposition of SiON.

Technical Solution

The present disclosure relates to a method of forming an etching pattern in a semiconductor manufacturing process. Unlike a conventional method of forming a four-layer structure composed of a photoresist film, an anti-reflective film, a SiON film, and an organic hard mask film on a wafer, as preparation for an etching process, the method according to the present disclosure is an innovative etching pattern forming method capable of implementing the same etching pattern as is formed by the conventional method, using a double-layer structure composed of a photoresist film and a multifunctional organic-inorganic mask film.

Specifically, to etch a silicon or silicon compound layer in a semiconductor manufacturing process, an organic film and an inorganic film are sequentially deposited to appropriate thicknesses, respectively, on an object to be etched. An organic carbon film containing a large amount of carbon atoms is first coated on the object, a SiON film is then deposited thereon by chemical vapor deposition, an anti-reflective film is then coated thereon, and a photoresist is finally coated thereon, followed by patterning. The SiON film is etched with fluorine gas by using the patterned photoresist as a mask, the organic carbon film is then etched with oxygen gas, and a silicon or silicon oxide layer is finally etched with fluorine gas to form a pattern.

Unlike the conventional etching process using a three-layer structure composed of the organic carbon film, the SiON film, the anti-reflective film, the present disclosure employs a single-layer structure composed of a multifunctional organic-inorganic mask film exhibiting the properties of both of an organic material and an inorganic material including. The multifunctional organic-inorganic mask film is coated on an object to be etched, and then a photoresist is coated thereon, followed by patterning. Thereafter, by using the patterned photoresist as a mask, the multifunctional organic-inorganic mask film including organic and inorganic materials is etched at one time with fluorine gas, oxygen gas, or a gas mixture containing them, and a silicon or silicon oxide layer is etched to form a pattern.

The multifunctional organic-inorganic mask film including organic and inorganic materials can be easily formed by spin coating and heat treatment without requiring the use of a physical or chemical deposition method. The multifunctional organic-inorganic mask film including organic and inorganic materials may be formed to have a thickness of 100 to 10,000 Å, but is not limited thereto, and may be baked at a temperature in a range of 150° C. to 400° C. for 1 to 5 minutes.

The multifunctional organic-inorganic mask film including organic and inorganic materials is required to function as an anti-reflective film during the exposure of the photoresist film and to have adequate etching resistance to etching gas.

Here, the multifunctional organic-inorganic mask film including organic and inorganic materials refers to a film that can be applied on a wafer by spin coating and is composed of 20% to 80% by weight of a Si compound, 20% to 80% by weight of carbon, and 1% to 20% by weight of other elements such as oxygen and hydrogen. The film may have an n value (refractive index value) of 1.4 to 1.95 at a wavelength of 193 nm, and a k value (extinction coefficient value) of 0.25 to 0.85.

The composition for forming the multifunctional organic-inorganic mask film including organic and inorganic materials contains 3% to 50% by weight of a Si compound containing carbon, 50% to 97% by weight of the solvent, 0% to 10% by weight of the crosslinking agent, 0% to 5% by weight of the additive, and 0% to 3% by weight of the surfactant.

The Si compound containing carbon is a carbon silicon compound containing a terminal group capable of crosslinking, such as a hydroxyl group, an alkoxide group, and a carboxyl group. As the carbon-containing Si compound, for example, at least one selected from the group consisting of the following may be used: poly[dimethylsiloxane-co-(2-(3, 4-epoxycyclohexyl)ethyl)methylsiloxane], poly[dimethylsiloxane-co-2-(9,9-bis(4-hydroxyphenyl)fluorene)methylsiloxane], poly(dimethylsiloxane), diglycidyl ether terminated, poly(dimethylsiloxane), bis(hydroxyalkyl)terminated, poly(dimethylsiloxane-co-diphenyl siloxane), dihydroxyterminated, poly(dimethylsiloxane-co-methylhydrosiloxane), trimethylsilylterminated, poly(dimethylsiloxane)-graft-polyacrylate, and poly[dimethylsiloxane-co-methyl(3-hydroxypropyl)siloxane]-graft-poly(ethylene glycol) methyl ether.

The solvent is not particularly limited as long as it can dissolve the Si compound containing carbon. As the solvent, for example, at least one selected from the group consisting of the following may be used: propylene glycol monomethyl ether acetate (PGMEA), propylene glycol monomethyl ether (PGME), ethyl 3-ethoxypropionate (EEP), ethyl lactate (EL), cyclohexanone, and gamma butyrolactone (GBL).

As the crosslinking agent, at least one selected from the group consisting of the following may be used: tris(2,3-epoxypropyl)isocyanurate), trimethylol methane triglycidyl ether, trimethylol propane triglycidyl ether, triethylol ethane triglycidyl ether, hexamethylolmelamine, hexamethoxymethylmelamine, hexamethoxyethylmelamine, tetramethylol 2,4-diamino-1,3,5-triazine, tetramethoxymethyl-2,4-di-amino-1,3,5 -triazine, tetramethylol glycoluril, tetramethoxymethylurea, tetramethoxymethyl glycoluril, tetramethoxyethyl glycoluril, tetramethylolurea, tetramethoxyethylurea, and tetramethoxyethyl-2,4-diamino-1,3,5-triazine.

The additive is a thermal acid generator (TAG) that releases an acid during heat treatment. As the additive, for example, at least one selected from the group consisting of the following may be used: pyridinium p-toluenesulfonate, benzoin tosylate, tetrabromocyclohexadiene, 2-methylimidazole, 2-phenylimidazole, Ajicure MY-H, and Fujicure FXR-1030.

As the surfactant, at least one selected from the group consisting of the following may be used: anionic, nonionic, cationic, and amphoteric surfactants, and various mixtures thereof.

Advantageous Effects

The present disclosure can provide a novel process of employing a novel organic-inorganic mixed coating material that fundamentally has adequate etching resistance to etching gas and functions as an anti-reflective film. The method forms a multifunctional organic-inorganic mask film that can replace a three-layer structure composed of an organic carbon film, a SiON film, and an anti-reflective film required in a conventional method. Thus, the present disclosure can significantly simplify coating and heat treatment processes so as to dramatically reduce production time and cost. In addition, the present disclosure no longer requires expensive coating and deposition machines required by the conventional method, thereby reducing costs for investment and maintenance with respect to relevant machines.

In addition, the present disclosure no longer requires expensive raw materials, such as precursors, deposition equipment, or expensive organic hard masks used for chemical deposition of SiON, thereby dramatically reducing coast for raw materials.

BEST MODE

Hereinafter, the present disclosure will be described in more detail.

The present disclosure relates to a method of forming an etching pattern in a semiconductor manufacturing process. Unlike a conventional method of forming a four-layer structure composed of a photoresist film, an anti-reflective film, a SiON film, and an organic hard mask film on a wafer, as preparation of an etching process, the method according to the present disclosure is an innovative etching pattern forming method capable of implementing the same etching pattern as is formed by the conventional method, using a double-layer structure composed of a photoresist film and a multifunctional organic-inorganic mask film.

A novel etching pattern forming method according to the present disclosure includes coating a multifunctional organic-inorganic mask film including organic and inorganic materials on a substrate layer, coating a photoresist film on the multifunctional organic-inorganic mask film to form a mask, and etching the film with an appropriate gas to form a desired pattern. Specifically, the present disclosure relates to a method of forming an etching pattern for a silicon or silicon compound layer, the etching pattern being a double-layer structure composed of a photoresist film and a multifunctional organic-inorganic mask film instead of a four-layer structure composed of a photoresist film, an anti-reflective film, a SiON film, and an organic hard mask film formed on a wafer to be etched. The method includes the steps of: i) primarily forming a multifunctional organic-inorganic mask film by applying a liquid multifunctional organic-inorganic mask film composition containing a solvent, a silicon compound, a crosslinking agent, an additive, and a surfactant and capable of being spin coated onto the wafer to be etched, using a spin coater, at a speed of 100 to 4000 rpm, and then by heating the composition to a temperature of 100° C. to 400° C. for 20 to 600 seconds; ii) secondarily forming a photoresist film for pattern formation on the formed multifunctional organic-inorganic mask film; iii) forming a photoresist pattern through exposure and development; and iv) performing dry etching with an etching gas by using the photoresist pattern as a mask to form the pattern for the silicon or silicon compound layer.

The multifunctional organic-inorganic mask film including organic and inorganic materials can be easily formed by spin coating and heat treatment without requiring the use of a physical or chemical deposition method. The multifunctional organic-inorganic mask film including organic and inorganic materials may be formed to have a thickness of 100 to 10,000 Å, but is not limited thereto, and may be baked at a temperature in a range of 100° C. to 400° C. for 20 seconds to 5 minutes, preferably at a temperature in a range of 150° C. to 400° C. for 1 to 5 minutes.

Here, the multifunctional organic-inorganic mask film including organic and inorganic materials refers to a film that can be applied on the wafer by spin coating and is composed of 20% to 79% by weight of a Si compound, 20% to 79% by weight of carbon, and 1% to 20% by weight of other elements such as oxygen and hydrogen.

The film may have an n value (refractive index value) of 1.4 to 1.95 at a wavelength of 193 nm, and a k value (extinction coefficient value) of 0.25 to 0.85.

The composition for forming the multifunctional organic-inorganic mask film including organic and inorganic materials contains 3% to 50% by weight of a Si compound containing carbon, 50% to 97% by weight of the solvent, 0% to 10% by weight of the crosslinking agent, 0% to 5% by weight of the additive, and 0% to 3% by weight of the surfactant.

The Si compound containing carbon is a carbon silicon compound containing a terminal group capable of crosslinking such as a hydroxyl group, an alkoxide group, and a carboxyl group.

As the carbon-containing Si compound, for example, at least one selected from the group consisting of the following may be used: poly[dimethylsiloxane-co-(2-(3,4-epoxycyclohexyl)ethyl)methylsiloxane], poly[dimethylsiloxane-co-2-(9,9-bis(4-hydroxyphenyl)fluorene)methylsiloxane], poly(dimethylsiloxane), diglycidyl ether terminated, poly(dimethylsiloxane), bis(hydroxyalkyl)terminated, poly(dimethylsiloxane-co-diphenylsiloxane), dihydroxyterminated, poly(dimethylsiloxane-co-methylhydrosiloxane), trimethylsilylterminated, poly(dimethylsiloxane)-graft-polyacrylate, and poly[dimethylsiloxane-co-methyl(3-hydroxypropyl)siloxane]-graft-poly(ethylene glycol) methyl ether.

The solvent is not particularly limited as long as it can dissolve the Si compound containing carbon. As the solvent, for example, at least one selected from the group consisting of the following may be used: propylene glycol monomethyl ether acetate (PGMEA), propylene glycol monomethyl ether (PGME), ethyl 3-ethoxypropionate (EEP), ethyl lactate (EL), cyclohexanone, and gamma butyrolactone (GBL).

As the crosslinking agent, at least one selected from the group consisting of the following may be used: tris(2,3-epoxypropyl)isocyanurate), trimethylol methane triglycidyl ether, trimethylol propane triglycidyl ether, triethylol ethane triglycidyl ether, hexamethylolmelamine, hexamethoxymethylmelamine, hexamethoxyethylmelamine, tetramethylol 2,4-diamino-1,3,5-triazine, tetramethoxymethyl-2,4-diamino-1,3,5 -triazine, tetramethylol glycoluril, tetramethoxymethylurea, tetramethoxymethyl glycoluril, tetramethoxyethyl glycoluril, tetramethylolurea, tetramethoxyethylurea, and tetramethoxyethyl-2,4-diamino-1,3,5-triazine.

The additive is a thermal acid generator (TAG) that releases an acid during heat treatment. As the additive, for example, at least one selected from the group consisting of the following may be used: pyridinium p-toluenesulfonate, benzoin tosylate, tetrabromocyclohexadiene, 2-methylimidazole, 2-phenylimidazole, Ajicure MY-H, and Fujicure FXR-1030.

As the surfactant, at least one selected from the group consisting of the following may be used: anionic, nonionic, cationic, and amphoteric surfactants, and various mixtures thereof Detailed contents about the objectives, technical configurations, and operational effects thereof according to the present disclosure will be more clearly understood from the following detailed description.

In the present disclosure, a substrate layer is coated with a multifunctional organic-inorganic mask film including organic and inorganic materials, the multifunctional organic-inorganic mask film is coated on a substrate layer, and then a photoresist film is coated thereon, followed by exposure to form a mask.

The multifunctional organic-inorganic mask film including organic and inorganic materials may be formed to have a thickness of 100 to 10,000 Å, but is not limited thereto, and may be baked at a temperature in a range of 150° C. to 400° C. for 1 to 5 minutes. A light source for forming the pattern may be selected from the group consisting of light sources having wavelengths of 13.5 nm, 193 nm, 248 nm, and 365 nm, and E-beam.

Dry etching is performed with an etching gas capable of etching the multifunctional organic-inorganic mask film including organic and inorganic materials by using the formed mask. The etching gas used for the dry etching may be one gas selected from or a gas mixture of at least two selected from the group consisting of: inert gas such as argon or nitrogen; gas having molecules containing at least one fluorine atom; and oxygen gas.

The composition for forming the multifunctional organic-inorganic mask film including organic and inorganic materials contains 3% to 50% by weight of the Si compound containing carbon, 50% to 97% by weight of the solvent, 0% to 10% by weight of the crosslinking agent, 0% to 5% by weight of the additive, and 0% to 3% by weight of the surfactant.

The Si compound containing carbon is a carbon silicon compound containing a terminal group capable of crosslinking such as a hydroxyl group, an alkoxide group, and a carboxyl group. As the carbon-containing Si compound, for example, at least one selected from the group consisting of the following may be used: poly[dimethylsiloxane-co-(2-(3,4-epoxycyclohexyl)ethyl)methylsiloxane], poly[dimethylsiloxane-co-2-(9,9-bis(4-hydroxyphenyl)fluorene)methylsiloxane], poly(dimethylsiloxane), diglycidyl ether terminated, poly(dimethylsiloxane), bis(hydroxyalkyl)terminated, poly(dimethylsiloxane-co-diphenyl siloxane), dihydroxyterminated, poly(dimethylsiloxane-co-methylhydrosiloxane), trimethylsilylterminated, poly(dimethylsiloxane)-graft-polyacrylate, and poly[dimethylsiloxane-co-methyl(3-hydroxypropyl)siloxane]-graft-poly(ethylene glycol) methyl ether.

The solvent is not particularly limited as long as it can dissolve the Si compound containing carbon. As the solvent, for example, at least one selected from the group consisting of the following may be used: propylene glycol monomethyl ether acetate (PGMEA), propylene glycol monomethyl ether (PGME), ethyl 3-ethoxypropionate (EEP), ethyl lactate (EL), cyclohexanone, and gamma butyrolactone (GBL).

As the crosslinking agent, at least one selected from the group consisting of the following may be used: tris(2,3-epoxypropyl)isocyanurate), trimethylol methane triglycidyl ether, trimethylol propane triglycidyl ether, triethylol ethane triglycidyl ether, hexamethylolmelamine, hexamethoxymethylmelamine, hexamethoxyethylmelamine, tetramethylol 2,4-diamino-1,3,5-triazine, tetramethoxymethyl-2,4-diamino-1,3,5 -triazine, tetramethylol glycoluril, tetramethoxymethylurea, tetramethoxymethyl glycoluril, tetramethoxyethyl glycoluril, tetramethylolurea, tetramethoxyethylurea, and tetramethoxyethyl-2,4-diamino-1,3,5-triazine.

The additive is a thermal acid generator (TAG) that releases an acid during heat treatment. As the additive, for example, at least one selected from the group consisting of the following may be used: pyridinium p-toluenesulfonate, benzoin tosylate, tetrabromocyclohexadiene, 2-methylimidazole, 2-phenylimidazole, Ajicure MY-H, and Fujicure FXR-1030.

As the surfactant, at least one selected from the group consisting of the following may be used: anionic, nonionic, cationic, and amphoteric surfactants, and various mixtures thereof The present disclosure has been described in detail above in connection with a preferred embodiment of the disclosure.

Hereinafter, preferred Examples and Comparative Examples of the present disclosure will be described below. However, the following Examples are only examples of the present disclosure, and the present disclosure is not limited thereto.

MODE FOR INVENTION

Hereinafter, preferred Examples and Comparative Examples of the present disclosure will be described below. However, the following Examples are only examples of the present disclosure, and the present disclosure is not limited thereto.

EXAMPLES 1 TO 5 AND COMPARATIVE EXAMPLES 1 TO 3

EXAMPLE 1

7 g of poly[dimethylsiloxane-co-2-(9,9-bi s(4-hydroxyphenyl)fluorene)methylsiloxane], 0.35 g of tetramethoxyethyl glycoluril, 0.1 g of pyridinium p-toluenesulfonate, 0.07 g of polyoxyethylene lauryl ether, and 93 g of propylene glycol monomethyl ether acetate were mixed and stirred well, and then filtered through a 30-nm pore size filter to prepare a multifunctional organic-inorganic mask film coating solution.

The coating solution was injected on a substrate layer to a thickness of 1000 Å using a spin coater or appropriate coating equipment, followed by baking at a temperature of 240° C. for 2 minutes to form a film. Thereafter, an ArF photoresist was coated on the film to a thickness of 1500 Å, and then exposed with ArF exposure equipment from ASML (manufacturer of ArF Equipment) at 24 mJ to form a mask with a 40 nm pattern. Finally, the film was etched with an etching gas mixture containing $CF_4$ by using the formed mask, and a silicon oxide layer is etched to a depth of 500 Å.

EXAMPLE 2

Pattern formation was performed in the same manner as in Example 1 except that 8.5 g of poly[dimethylsiloxane-co-(2-(3,4-epoxycyclohexyl)ethyl)methylsiloxane], 0.43 g of tetramethoxyethyl glycoluril, 0.13 g of pyridinium p-toluenesulfonate, 0.085 g of polyoxyethylene lauryl ether, and 91.5 g of propylene glycol monomethyl ether acetate were mixed and stirred well, and then filtered through a 30-nm pore size filter to prepare a multifunctional organic-inorganic mask film coating solution.

EXAMPLE 3

Pattern formation was performed in the same manner as in Example 1 except that 8.5 g of poly(dimethylsiloxane-co-diphenylsiloxane), dihydroxyterminated, 0.43 g of tetramethoxyethyl glycoluril, 0.13 g of pyridinium p-toluenesulfonate, 0.085 g of polyoxyethylene lauryl ether, and 91.5 g of propylene glycol monomethyl ether acetate were mixed and stirred well, and then filtered through a 30-nm pore size filter to prepare a multifunctional organic-inorganic mask film coating solution.

EXAMPLE 4

7 g of poly[dimethylsiloxane-co-2-(9,9-bi s(4-hydroxyphenyl)fluorene)methylsiloxane], 0.35 g of tetramethoxyethyl glycoluril, 0.1 g of pyridinium p-toluenesulfonate, 0.087 g of polyoxyethylene lauryl ether, and 93 g of propylene glycol monomethyl ether acetate were mixed and stirred well, and then filtered through a 30-nm pore size filter to prepare a multifunctional organic-inorganic mask film coating solution.

The coating solution was injected on a substrate layer to a thickness of 1000 Å using a spin coater or appropriate coating equipment, followed by baking at a temperature of 240° C. for 2 minutes to form a film. Thereafter, a KrF photoresist was coated on the film to a thickness of 5400 Å, and then exposed with KrF exposure equipment from Nikon at 30 mJ to form a mask with a 250 nm pattern. Finally, the film was etched with an etching gas mixture containing $CF_4$ by using the formed mask, and a silicon oxide layer is etched to a depth of 500 Å.

EXAMPLE 5

7 g of poly[dimethylsiloxane-co-2-(9,9-bis(4-hydroxyphenyl)fluorene)methylsiloxane], 0.35 g of tetramethoxyethyl glycoluril, 0.1 g of pyridinium p-toluenesulfonate, 0.07 g of polyoxyethylene lauryl ether, and 93 g of propylene glycol monomethyl ether acetate were mixed and stirred well, and then filtered through a 30-nm pore size filter to prepare a multifunctional organic-inorganic mask film coating solution.

The coating solution was injected on a substrate layer to a thickness of 1000 Å using a spin coater or appropriate coating equipment, followed by baking at a temperature of 240° C. for 2 minutes to form a film. Thereafter, an I-line photoresist was coated on the film to a thickness of 6500 Å, and then exposed with I-line exposure equipment from Nikon at 140 mJ to form a mask with a 500 nm pattern. Finally, the film was etched with an etching gas mixture containing $CF_4$ by using the formed mask, and a silicon oxide layer is etched to a depth of 500 Å.

Comparative Example 1

An organic hard mask film was coated on a substrate layer to a thickness of 3100 Å using a spin coater, followed by baking at a temperature of 240° C. for 2 minutes to form a film. Thereafter, a SiON film was formed to a thickness of 500 Å using deposition equipment, and an anti-reflective film was coated to a thickness of 300 Å using a spin coater, followed by baking at a temperature of 240° C. for 1 minute to form a film. Thereafter, an ArF photoresist was coated on the film to a thickness of 1500 Å, and then exposed with ArF exposure equipment from ASML (manufacturer of ArF Equipment) at 24 mJ to form a mask with a 40 nm pattern. Finally, the films were sequentially etched with an etching gas mixture containing $CF_4$ and an etching gas mixture containing $O_2$ by using the formed mask, and a silicon oxide layer is etched to a depth of 500 Å.

Comparative Example 2

An organic hard mask film was coated on a substrate layer to a thickness of 3100 Å using a spin coater, followed by baking at a temperature of 240° C. for 2 minutes to form a film. Thereafter, a SiON film was formed to a thickness of 500 Å using deposition equipment, and an anti-reflective film was coated to a thickness of 300 Å using a spin coater, followed by baking at a temperature of 240° C. for 1 minute to form a film. Thereafter, a KrF photoresist was coated on the film to a thickness of 3200 Å, and then exposed with KrF exposure equipment from Nikon at 30 mJ to form a mask with a 250 nm pattern. Finally, the films were sequentially etched with an etching gas mixture containing $CF_4$ and an etching gas mixture containing $O_2$ by using the formed mask, and a silicon oxide layer is etched to a depth of 500 Å.

Comparative Example 3

An organic hard mask film was coated on a substrate layer to a thickness of 3100 Å using a spin coater, followed by baking at a temperature of 240° C. for 2 minutes to form a film. Thereafter, a SiON film was formed to a thickness of 500 Å using deposition equipment, and an anti-reflective film was coated to a thickness of 300 Å using a spin coater, followed by baking at a temperature of 240° C. for 1 minute to form a film. Thereafter, an I-line photoresist was coated on the film to a thickness of 6500 Å, and then exposed with I-line exposure equipment from Nikon at 140 mJ to form a mask with a 500 nm pattern. Finally, the films were sequentially etched with an etching gas mixture containing $CF_4$ and an etching gas mixture containing $O_2$ by using the formed mask, and a silicon oxide layer is etched to a depth of 500 Å.

Characteristic Measurement

<Optical Property Test>

The refractive index n and extinction coefficient k of multifunctional organic-inorganic mask films including organic and inorganic materials formed in Examples 1 to 5 and organic hard mask films and SiON films formed in Comparative Examples 1 to 3 were measured, and the results are illustrated in Table 1. As a measurement device, an ellipsometer (Horiba) was used.

TABLE 1

| Sample | | Refractive index (n@193 nm) | Extinction coefficient (k@193 nm) |
|---|---|---|---|
| Example 1 | | 1.64 | 0.52 |
| Example 2 | | 1.74 | 0.55 |
| Example 3 | | 1.66 | 0.64 |
| Example 4 | | 1.64 | 0.52 |
| Example 5 | | 1.64 | 0.52 |
| Comparative Example 1 | Organic hard mask film | 1.38 | 0.48 |
| Comparative Example 2 | | 1.38 | 0.48 |
| Comparative Example 3 | | 1.38 | 0.48 |
| Comparative Example 1 | SiON | 1.54 | 0.02 |
| Comparative Example 2 | | 1.54 | 0.02 |
| Comparative Example 3 | | 1.54 | 0.02 |

As a result of comparing Examples 1 to 5 in which a multifunctional organic-inorganic mask film including organic and inorganic materials was coated on an object to be etched instead of a three-layer structure composed of an organic carbon film, a SiON film, and an anti-reflective film and then a photoresist was coated and patterned, with Comparative Examples 1 to 3 in which a three-layer structure composed of an organic carbon film, a SiON film, and an anti-reflective film was coated on an object to be etched and then a photoresist was coated and patterned, it was found that there was no difference in both the refractive index value and the extinction coefficient value.

<Pattern Formation Test>

The width and depth of patterns formed by dry etching the films formed in Examples 1 to 5 and Comparative Examples 1 to 3 were measured. The cross-sections of the patterns were observed using a scanning electron microscope (FE-SEM, Hitachi), and the measurement results are illustrated in Table 2.

TABLE 2

| Sample | Pattern width | Pattern depth |
|---|---|---|
| Example 1 | 39 nm | 500 Å |
| Example 2 | 39 nm | 500 Å |
| Example 3 | 39 nm | 500 Å |
| Example 4 | 251 nm | 500 Å |
| Example 5 | 495 nm | 500 Å |
| Comparative Example 1 | 39 nm | 500 Å |
| Comparative Example 2 | 252 nm | 500 Å |
| Comparative Example 3 | 495 nm | 500 Å |

The following results were obtained by comparing Examples 1 to 5 in which the multifunctional organic-inorganic mask film including organic and inorganic materials was coated on the object to be etched instead of the three-layer structure of composed of the organic carbon film, the SiON film, and the anti-reflective film and then the photoresist was coated and patterned, with Comparative Examples 1 to 3 in which the three-layer structure composed of the organic carbon film, the SiON film, and the anti-reflective film was coated on the object to be etched and then the photoresist was coated and patterned.

First, Examples 1 to 3 and Comparative Example 1, in which a mask with a 40 nm pattern was formed by exposure with ArF exposure equipment at 24 mJ, exhibited the same pattern width and the same pattern depth.

Second, Example 4 and Comparative Example 2, in which a mask with a 250 nm pattern was formed by exposure with KrF exposure equipment at 30 mJ, exhibited the same pattern width and the same pattern depth.

Third, Example 5 and Comparative Example 3, in which a mask with a 500 nm pattern was formed by exposure with I-line exposure equipment at 140 mJ, exhibited the same pattern width and the same pattern depth.

Although the present disclosure has been described in detail with reference to the specific features, it will be apparent to those skilled in the art that this description is only for a preferred embodiment and does not limit the scope of the present disclosure. Thus, the substantial scope of the present disclosure will be defined by the appended claims and equivalents thereof

The invention claimed is:

1. A method of forming an etching pattern for a silicon or silicon compound layer, by forming a double-layer structure composed of a photoresist film and a multifunctional organic-inorganic mask film on a wafer to be etched, the method comprising the steps of:
   i) primarily forming the multifunctional organic-inorganic mask film by rotating a liquid multifunctional organic-inorganic mask film composition containing;
      (a) 3% to 50% by weight of a compound selected from among poly[dimethylsiloxane-co-2-(9,9-bis(4-hydroxyphenyl)fluorene)methylsiloxane], poly[dimethylsiloxane-co-(2-(3,4-epoxycyclohexyl)ethyl)methylsiloxane], and poly(dimethylsiloxane-co-diphenylsiloxane)dihydroxy-terminated as a carbon silicon compound containing a terminal group capable of crosslinking such as a hydroxyl group, an alkoxyide group, and a carboxyl group;
      (b) more than 0% and up to 10% by weight of tetramethoxyethyl glycoluril as a crosslinking agent, and more than 0% and up to 5% by weight of pyridinium p-toluenesulfonate as a thermal acid generator;
      (c) more than 0% and up to 5% by weight of polyoxyethylene lauryl ether as a surfactant; and
      (d) 50% to 97% by weight of propylene glycol monomethyl ether acetate as a solvent, using a spin coater at a speed of 100 to 4000 rpm and coating the composition with a thickness of 1000 Å, and then by heating the composition to a temperature of 240° C. for 120 seconds;
   ii) secondarily forming the photoresist film for pattern formation on the formed multifunctional organic-inorganic mask film to a thickness of 1000 Å to 6500 Å;
   iii) forming a photoresist pattern through exposure and development; and
   iv) performing dry etching with an etching gas by using the photoresist pattern as a mask to form the pattern for the silicon or silicon compound layer.

2. The method of claim 1, wherein the multifunctional organic-inorganic mask film in step i) comprises 20% to 79% by weight of carbon, 20% to 79% by weight of silicon, and 1% to 20% by weight of other elements including oxygen and hydrogen.

3. The method of claim 1, wherein a light source for forming the pattern in step iii) is selected from the group consisting of light sources having wavelengths of 13.5 nm, 193 nm, 248 nm, and 365 nm, and E-beam.

4. The method of claim 1, wherein the etching gas used for the dry etching in step iv) after the pattern is formed is one gas selected from or a gas mixture of at least two selected from the group consisting of: inert gas such as argon or nitrogen; gas having molecules containing at least one fluorine atom; and oxygen gas.

* * * * *